(12) United States Patent
Xu

(10) Patent No.: US 6,326,847 B1
(45) Date of Patent: Dec. 4, 2001

(54) HIGH GAIN, HIGH SPEED, RAIL-TO-RAIL AMPLIFIER

(75) Inventor: Ping Xu, Milpitas, CA (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/592,099

(22) Filed: Jun. 12, 2000

Related U.S. Application Data

(63) Continuation of application No. 09/150,861, filed on Sep. 10, 1998, now Pat. No. 6,107,883.

(51) Int. Cl.[7] .................................................... H03F 3/45
(52) U.S. Cl. ........................................... 330/253; 330/255
(58) Field of Search .................................... 330/252, 253, 330/255, 257

(56) References Cited

U.S. PATENT DOCUMENTS

| | | | |
|---|---|---|---|
| 4,829,266 | 5/1989 | Pernici et al. | 330/253 |
| 4,990,862 | 2/1991 | Narabu et al. | 330/253 |
| 5,293,136 | 3/1994 | Ryat | 330/258 |
| 5,315,264 | 5/1994 | Sundby et al. | 330/253 |
| 5,334,948 | 8/1994 | Fong et al. | 330/253 |
| 5,521,553 | 5/1996 | Butler | 330/265 |
| 5,574,401 | 11/1996 | Spitalny | 330/253 |
| 5,736,886 | 4/1998 | Mangelsdorf et al. | 327/310 |
| 5,907,259 | * 5/1999 | Yamada et al. | 330/255 X |
| 5,917,378 | * 6/1999 | Juang | 330/253 |
| 6,052,025 | * 4/2000 | Chang et al. | 330/253 |
| 6,066,985 | * 5/2000 | Xu | 330/253 |
| 6,100,762 | * 8/2000 | Kato | 330/255 |
| 6,107,883 | * 8/2000 | Xu | 330/253 |

* cited by examiner

*Primary Examiner*—Steven J. Mottola

(57) ABSTRACT

A high gain, high speed rail-to-rail amplifier that comprises two symmetrical input stages: an n-input stage responsive to middle and high range input voltages and a p-input stage responsive to low and middle range input voltages. A gain stage, in electrical communication with each of the input stages, receives current from the n-input stage when the input voltage signal is in the middle or high ranges and receives current from the p-input stage when the input voltage signal is in the low or middle ranges to provide amplification of the input voltage signal at the upper and lower ends of its range and provide increased amplification in the middle range. The amplifier further includes an output stage that includes two MOS transistors that cooperate to increase the output signal range and to provide the amplifier with increased driving ability.

11 Claims, 4 Drawing Sheets

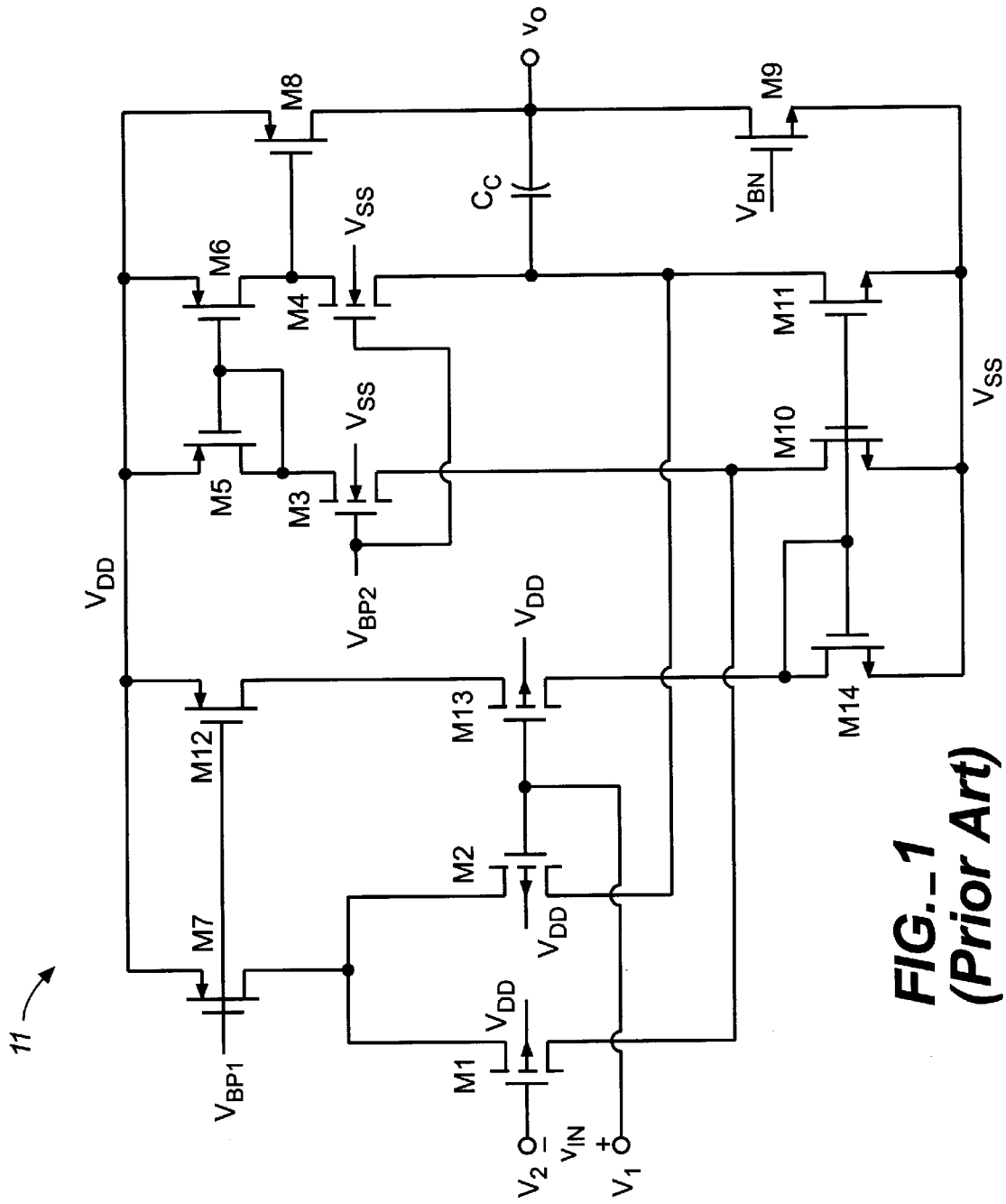
FIG._1 (Prior Art)

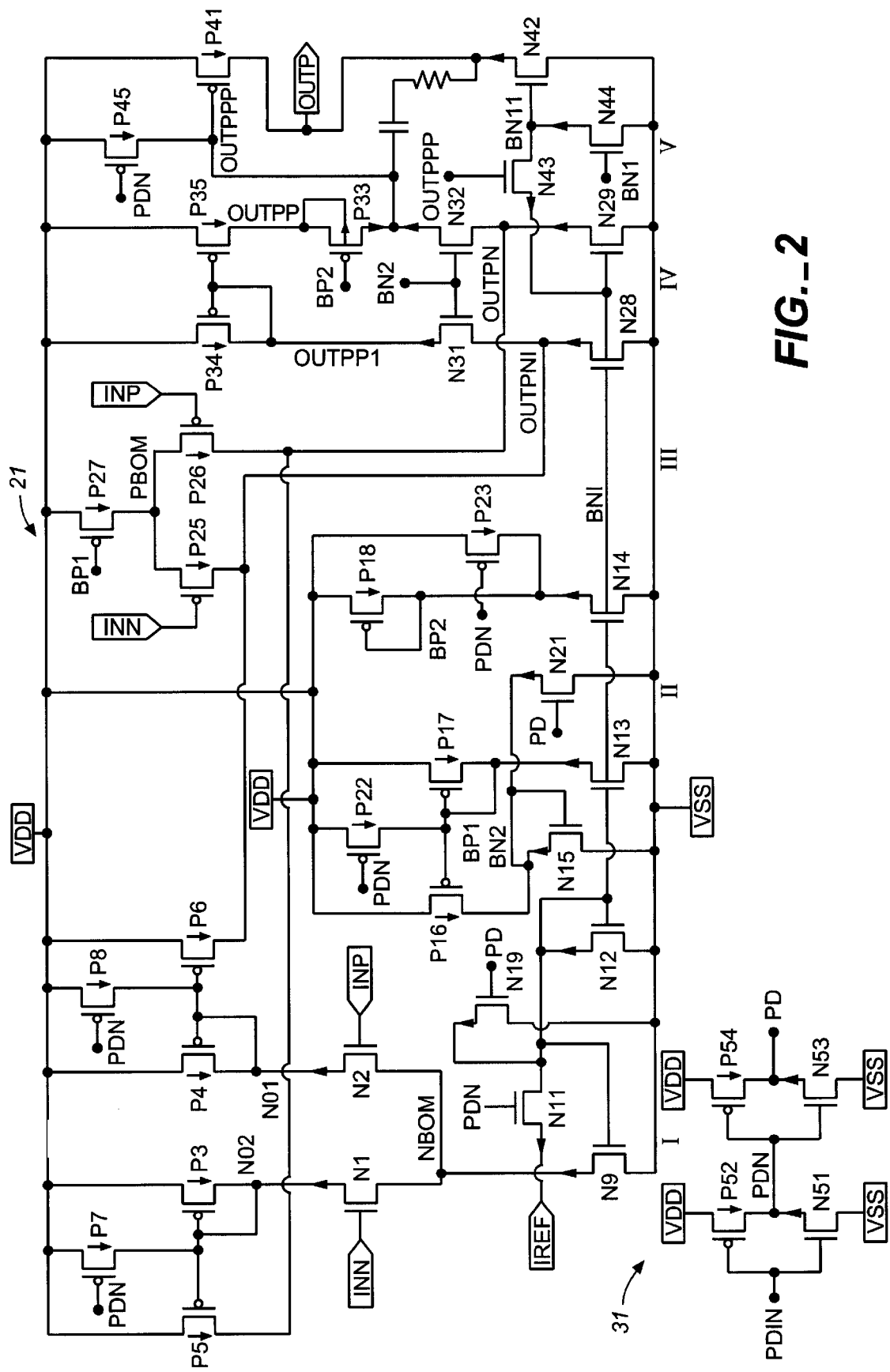
FIG._2

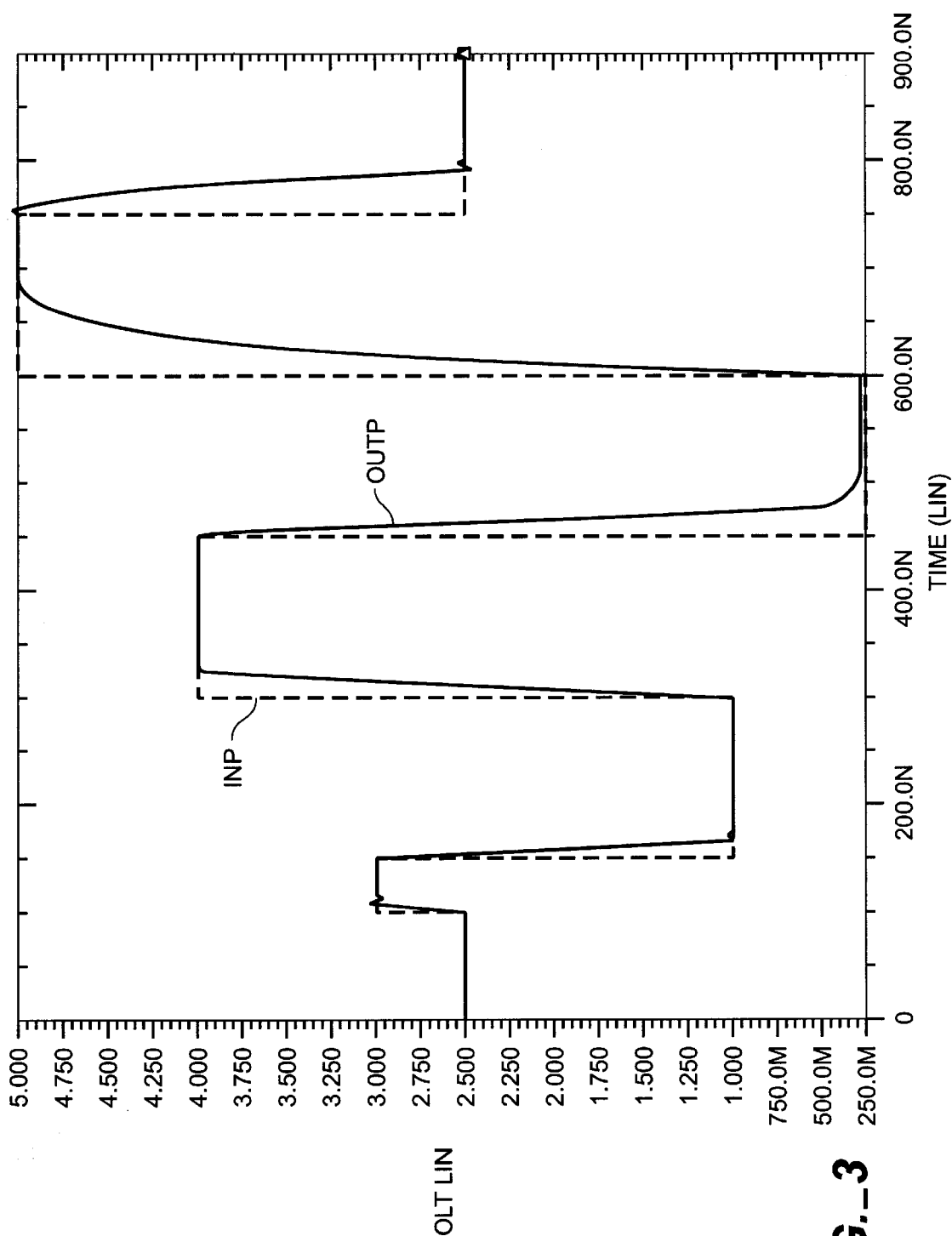
FIG._3

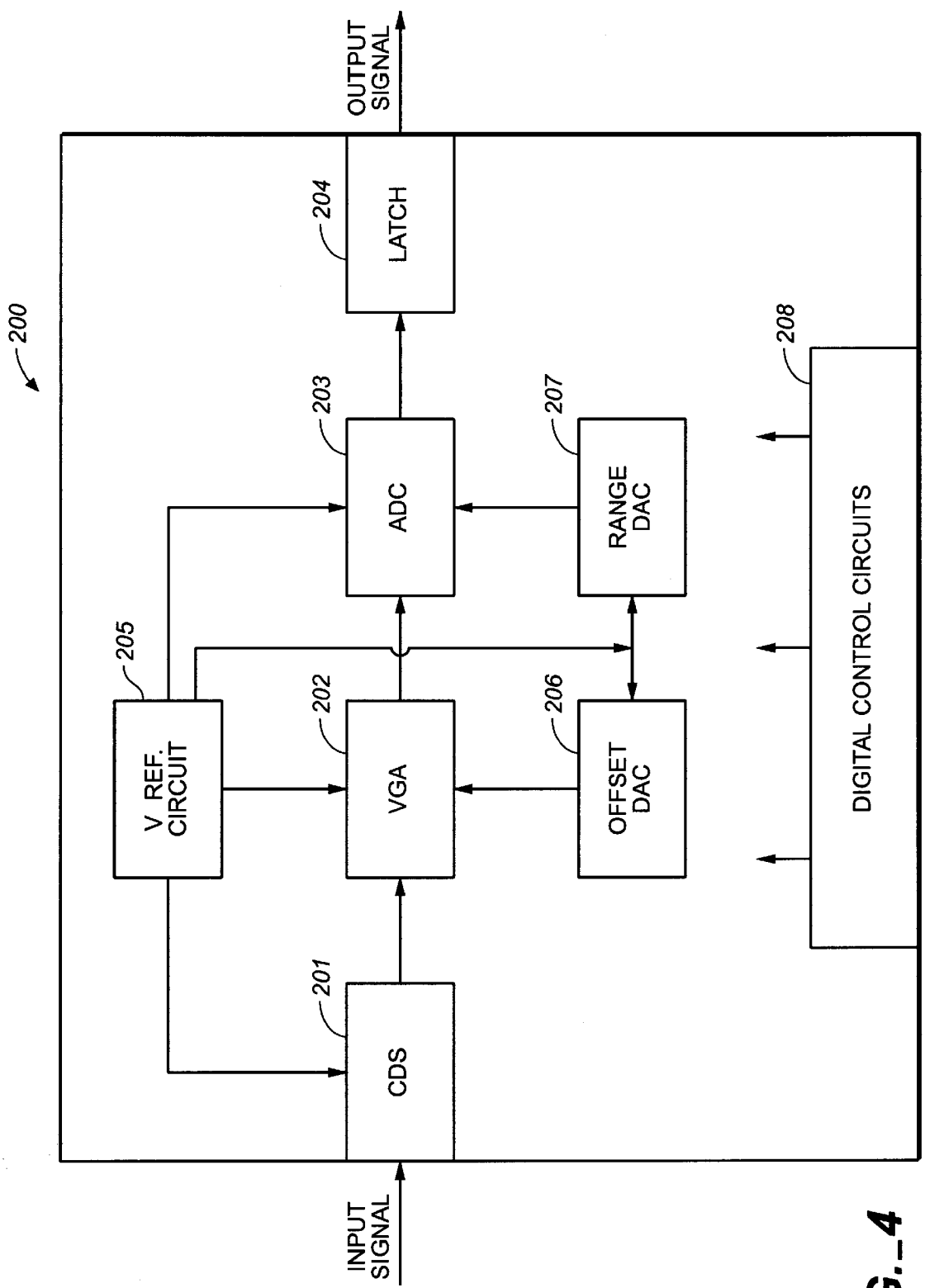
FIG._4

HIGH GAIN, HIGH SPEED, RAIL-TO-RAIL AMPLIFIER

CROSS REFERENCE TO RELATED APPLICATION

This application is a continuation of application Ser. No. 09/150,861 filed Sep. 10, 1998, now U.S. Pat. No. 6,107,883, which is incorporated by reference herein in its entirety.

BACKGROUND OF THE INVENTION

1. Field of the Invention

This invention pertains to a high gain, high speed rail-to-rail amplifier, and more particularly to a high gain, high speed rail-to-rail amplifier that has two symmetrical input stages to provide amplification of input signals at the upper and lower ends of the input voltage range and to provide increased amplification of input signals in the middle voltage range. The high gain, high speed rail-to-rail amplifier of this invention is designed to be used in a variety of applications including scanners and other imaging devices.

2. Description of the Related Art

A conventional folded, cascode amplifier comprised of MOS transistors is shown in FIG. 1. This amplifier 11 employs a single cascoded input stage comprised of two input transistors M1 and M2 which have their substrates coupled to supply voltage $V_{DD}$. Input signals $V_1$ and $V_2$ (the difference of which represents a differential input signal $\upsilon_{IN}$) are applied to the gates of M1 and M2 respectively. Current source transistor M7 is biased by voltage $V_{BP1}$ and generates a current, which is supplied to input transistors M1 and M2.

Currents are drawn from the sources of input transistors M1 and M2 and are combined with currents drawn from the drains of transistors M3 and M4 which form part of the cascoded input stage and also act to amplify the input voltage signal. M3 and M4, which have their substrates coupled to supply voltage $V_{SS}$, have a common-gate connection to which a bias voltage $V_{BP2}$ is applied. Transistors M5 and M6 form a current mirror that acts as a load for M3 and M4.

Transistors M3 and M4 are provided with current source transistors M10 and M11, each of which forms a current mirror with transistor M14. As a result of this connection, the current generated in the branch containing M12, M13 and M14 is induced in M10 and M11 to provide current for M3 and M4. Voltages $V_{BP1}$ and $V_1$ are applied to the gates of M12 and M13 respectively to generate the current in the M12, M13, M14 branch.

The output stage, which is coupled to the cascoded input stage through a capacitor $C_C$, includes transistor M8, the gate of which is driven by the voltage at the drain-drain connection between transistors M4 and M6. A single-ended voltage output $\upsilon_O$ is taken off of the common drain connection between M8 and a current source transistor M9 which is biased by voltage $V_{BN}$ to generate current for the output stage.

One problem with the type of conventional amplifier shown in FIG. 1 is that the single input stage is configured so that the magnitude of the differential input voltage signal $\upsilon_{IN}$ must be larger than $V_T$ (approx. 0.7 V) to turn the amplifier on. Thus, amplifier 11 is unable to provide any amplification of differential signals below this threshold.

Another problem with amplifier 11 is that it is unable to provide a full range output because of the configuration of the current source in the output stage. Having limited input and output ranges, amplifier 11 generates an output signal $\upsilon_O$ that does not follow $\upsilon_{IN}$ well at the low and high ends of the input range when amplifier 11 is used as a voltage follower. This ultimately leads to large distortion in the digital output signal produced by the scanner when amplifier 11 is employed in connection with an analog-to-digital converter in the scanner circuitry.

3. Objects of the Invention

Therefore, it is an object of this invention to overcome the aforementioned problems.

It is another object of this invention to provide a high gain, high speed rail-to-rail amplifier that generates an output signal which tracks the input signal very closely when used as a voltage follower, even at the high and low ends of the input voltage range.

It is a further object of this invention to provide a rail-to-rail amplifier having two symmetrical input stages, one that is responsive to input voltages in the low to middle ranges and the other that is responsive to input voltages in the middle to high ranges, and a gain stage which cooperates with the input stages to provide amplification of input voltages at the high and low ends of its range and to further increase the amplification of middle range input voltages.

It is still another object of this invention to provide a rail-to-rail amplifier having an output stage which is capable of generating a wide range of output voltages while efficiently controlling the current used for charging the load.

It is yet another object of this invention to provide a rail-to-rail amplifier having a selectively controlled power down circuit to reduce the current drawn from the power supply.

SUMMARY OF THE INVENTION

A rail-to-rail amplifier is provided for amplifying an electrical input signal. The amplifier comprises an n-input stage comprising a pair of input MOS transistors responsive to the electrical input signal when it is between a first middle value and a high value, a p-input stage comprising a pair of input MOS transistors responsive to the electrical input signal when it is between a low value and a second middle value higher than the first middle value, and a gain stage in electrical communication with each of the input stages to amplify the electrical input signal. In accordance with the invention, the gain stage receives an electrical signal from the n-input stage when the electrical input signal is between the first middle value and the high value, receives an electrical signal from the p-input stage when the electrical input signal is between the low value and the second middle value, and receives an electrical signal from both the n-input stage and the p-input stage when the magnitude of the electrical input signal is between the first middle value and the second middle value.

The rail-to-rail amplifier further comprises an output stage comprising a pair of output MOS transistors interconnected to form an output node where an electrical output signal is generated, a first MOS transistor responsive to a first control signal, and a second MOS transistor responsive to a second control signal, wherein the first and second MOS transistors cooperate to increase the output signal range and to provide the amplifier with increased driving ability.

The rail-to-rail amplifier may further include a power down circuit for placing the amplifier in a power down mode when no input signal is applied for some period of time. The power down circuit selectively turns on certain transistors and turns other transistors off to significantly decrease the amount of dc current drawn by the amplifier from the power supply.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a conventional folded, cascode amplifier.

FIG. 2 is a high gain, high speed rail-to-rail amplifier constructed in accordance with embodiments of the invention.

FIG. 3 is a graphical representation of certain performance characteristics of the analog buffer of the present invention.

FIG. 4 is a block diagram showing the interconnection of various scanner circuit components, including a correlated double sampling (CDS) circuit and a variable gain amplifier (VGA) in which the rail-to-rail amplifier of the present invention is adapted to be embodied.

DESCRIPTION OF THE PREFERRED EMBODIMENTS

Referring to FIG. 2, a diagram of a high gain, high speed rail-to-rail amplifier 21 is illustrated in accordance with preferred embodiments of the invention. As shown in FIG. 2, the amplifier 21 has five stages designated by the roman numerals I–V. Stage I is an n-input stage which is used for high differential input voltages (about VSS+0.7 V to about VDD−0.1 V). Stage II is the bias circuit which receives a small input reference current IREF to generate bias voltages in the amplifier 21. Stage III is a p-input stage which is used for low differential input voltages (about VSS+0.1 V to about VDD−0.7 V). Stage IV is the high gain stage and stage V is the output stage. In accordance with CMOS technology, the amplifier 21 comprises a plurality of MOS transistors of both the NMOS and PMOS type. In the description and drawings herein NMOS transistors are designated with the prefix N and PMOS transistors with the prefix P.

The n-input stage (stage I) comprises a pair of input transistors N1 and N2 for receiving a differential input voltage signal which represents the difference between input voltage signals INN and INP. When the rail-to-rail amplifier 21 is used as a voltage follower, the output voltage node is coupled to the INN input voltage node in which case INP is the input voltage signal. INN and INP are applied to the gates of N1 and N2 respectively. A pair of load transistors P3 and P4 are coupled to input transistors N1 and N2. The common drain connection between N1 an P3 forms a node having a voltage NO2 and the common drain connection between N2 and P4 forms a node having a voltage NO1. The gate of P3 is connected to its drain and to the gate of transistor P5 to form a current mirror. A similar arrangement is provided on the other branch of the n-input stage, where a current mirror is formed by the coupling of transistor P4 to transistor P6.

Stage I further includes two transistors, P7 and P8, each of which has a gate that is responsive to a power down voltage PDN generated by a power down circuit which forms part of the amplifier 21. The drain of P7 is coupled to the common-gate node of P3 and P5 while the drain of P8 is coupled to the common-gate node of P4 and P6. The sources of transistors P3–P8 are each connected to a power supply VDD which may be 3 V, 5 V or other suitable voltage. When amplifier 21 is in a normal operating mode, PDN is high so transistors P7 and P8 are off.

The sources of N1 and N2 are coupled together and to the drain of current source transistor N9 to form a node where a voltage signal NBOM is generated. The source of N9 is connected to VSS which may be a second complementary power supply or ground.

The bias circuit (stage II) receives a small input reference current (IREF) of, for example, 100–150 $\mu$A. IREF is applied to the drain of transistor N11 which has its gate biased by power down voltage PDN. The source of N11 is coupled to the drain and gate of N12 which forms a current mirror with transistor N9. N12 also forms a current mirror with each of transistors N13 and N14 in the bias circuit. The bias circuit further includes transistor N15 which has its gate and drain connected together to form a node where voltage signal BN2 is produced. The sources of transistors N12, N13 and N14 are connected to VSS.

A pair of transistors, P16 and P17, connected in current mirror configuration, are respectively coupled to N15 and N13. The common gate connection between P16 and P17, which is also coupled to the common drain connection between P17 and N13, forms a node where voltage signal BP1 is produced. In addition, there is provided transistor P18 which has its gate and drain coupled together and to the drain of N14 to form a node where voltage signal BP2 is generated. The sources of P16, P17 and P18 are connected to VDD.

The bias circuit includes two transistors which are responsive to a power down voltage PD. Transistor N19 is interposed between VSS and the node formed by the interconnection between the gate of N9, the source of N11 and the drain and gate of N12. The gate of N19 is controlled by PD, which is low when the amplifier 21 is in the normal operating mode. Thus, N19 is off during normal operation. Another transistor controlled by PD is N21 which is positioned between the node where BN2 is produced and VSS. As is the case with N19, N21 is off during normal operation of amplifier 21.

In addition to controlling N11, power down voltage PDN is also used to control transistors P22 and P23. P22 and P23 are connected between VDD and the nodes where BP1 and BP2 are generated respectively. Since PDN is high when the amplifier 21 is in the normal operating mode, N11 is on and P22 and P23 are off during normal operation.

Stage III is the p-input stage which comprises a pair of input transistors P25 and P26 which receive the same differential input voltage signal applied to the n-input stage. INN and INP are applied to the gates of P25 and P26 respectively. The drain of current source transistor P27 is coupled to the common source connection between P25 and P26 to form a node having voltage PBOM. The source of P27 is coupled to VDD, and the gate of P27 is biased by voltage signal BP1 generated in the bias circuit.

The gain stage (stage IV) includes two transistors N28 and N29, each of which is in current mirror configuration with N12 in the bias circuit. The drains of N28 and N29 are respectively coupled to the drains of P25 and P26 to form nodes where voltage signals OUTPN1 and OUTPN are respectively generated. The drains of N28 and N29 are also respectively coupled to the sources of transistors N31 and N32 which have a common-gate connection that is biased by voltage signal BN2 from the bias circuit. The drain of N32 is coupled to the drain of transistor P33, the gate of which is biased by voltage signal BP2 from the bias circuit. Two load transistors, P34 and P35, form a current mirror and have their respective drains coupled to the drain of N31 and the source of P33. Voltage signal OUTPP1 is generated at the drain-drain connection between N31 and P34, and voltage signal OUTPP is generated at the source-drain connection between P33 and P35.

As previously noted, stage I (the n-input stage) is receptive to a differential voltage signal that is in an upper portion of the input voltage range. Typically, this higher voltage range extends from about VSS+0.7 V to about VDD−0.1 V. During operation, voltage changes within this range cause the current through transistors P3 and P4 to change. These current changes are "mirrored" by transistors P5 and P6 to generate two input currents. These input currents drawn from the drains of P5 and P6 flow to the gain stage (stage IV) where they are supplied to the drains of N29 and N28 respectively.

Input voltages in a lower portion of the input voltage range are handled by the p-input stage. Typically, this lower voltage range extends from about VSS+0.1 V to about VDD−0.7 V. Voltages in this range cause two input currents to be drawn from the drains of transistors P25 and P26 and supplied to the drains of N28 and N29 respectively.

For middle range voltages (about VSS+0.7 V to about VDD−0.7 V), both input stages are used. The n-input stage current of P5 combines with the p-input stage current of P26 and the n-input current of P6 combines with the p-input stage current of P25 to provide more current to the gain stage to increase the gain of middle range input voltages.

The output stage (stage V) includes transistors P41 and N42 having a common drain connection that form the output node, off of which the output voltage signal OUTP is taken. P41 is gated by OUTPPP which is generated at the common drain node of N32 and P33. A capacitor C1 and a resistor R1 connected in series are interposed between the node where OUTPPP is generated and the output node to minimize oscillations in the amplifier 21. Capacitor C1 has a capacitance of approximately 1 pF and is preferably a double-poly capacitor. Resistor R1 preferably has a resistance of about 3 KΩ.

The output stage further includes two transistors, N43 and N44, that cooperate to increase the output voltage range and provide more driving current to the load. N43 has its drain coupled to the gate of N29 and its source coupled to the gate of N42 and to the drain of N44 to form a node where voltage signal BN11 is produced. The source of N44 is coupled to VSS. As the output voltage OUTP increases, voltage OUTPPP, which controls N43, decreases. When OUTPPP falls below about VSS+1.5 V, N43 begins to turn off and act like a large resistor. When this occurs, N44, which is controlled by voltage BN1 from the bias circuit, continues to draw current causing the voltage BN11 to drop which causes the current flowing through N42 to decrease, leaving more current available for charging the load so OUTP may increase, as necessary, even at the higher end of its range.

The output stage further includes transistor P45 which is interposed between VDD and the node where OUTPPP is generated. P45 is responsive to power down voltage PDN. Thus, P45 is off during normal operation of amplifier 21.

As previously noted, amplifier 21 may also include a power down circuit to place amplifier 21 in a power down mode when it is idle (i.e., no input signal is applied for some period of time). In the power down mode, amplifier 21 draws only a small amount of dc current from the power supply. A suitable power down circuit for this purpose is identified by the reference numeral 31 and illustrated in FIG. 2. Power down circuit 31 includes two pairs of transistors, each pair comprising an NMOS transistor and a PMOS transistor with a common drain connection and a common gate connection. An input control signal PDIN is applied to the gates of the first pair of transistors N51 and P52 to generate power down voltage PDN which is applied to the gates of the second pair of transistors N53 and P54 to generate complementary power down voltage PD. The amplifier 21 is in power down mode when PDN is low and PD is high. In the power down mode, transistors P7, P8, N19, N21, P22, P23 and P45 are on and transistor N11 is off.

FIG. 3 is a voltage vs. time graph which shows that when the amplifier 21 is used as a voltage follower, the output signal (OUTP) tracks the input signal (INP) very well even when the input signal is at the high end of the range (i.e., close to VDD) or at the low end of the range (i.e., close to ground). In FIG. 3, VDD=5 V and VSS=0 V.

As previously noted, amplifier 21 is adapted to be used in connection with certain scanner circuit components. These components as well as certain other interrelated scanner circuit components are shown in block diagram form in FIG. 4 and may be fabricated on a single chip identified generally by the reference numeral 200. A correlated double sampling (CDS) circuit 201 samples, holds and amplifies an analog input signal that is generated by a charge-coupled device (not shown) in response to the input light signals. The output analog signal generated by the CDS circuit 201 is transmitted to a variable gain amplifier (VGA) 202 where the analog signal is further amplified. The amplification function of CDS circuit 201 and the further amplification performed by VGA 202 may be accomplished using amplifier 21 of the present invention which may be embodied in the CDS circuit 201 and/or VGA 202. The analog signal outputted from VGA 202 is then converted to a digital signal by an analog-to-digital converter (ADC) 203. The digitized signal is then input into a latch circuit 204 from which a digital output signal is generated. A voltage-current (V-I) reference circuit 205 provides accurate reference voltage and current signals to CDS circuit 201, VGA 202 and ADC 203.

An offset digital-to-analog converter (DAC) 206 and a range DAC 207 operate under the control of digital control circuits 208 and uses reference voltage and current signals from the V-I reference circuit 205 to provide analog signals to VGA 202 and ADC 203.

While the invention has been described in conjunction with specific embodiments, it will be evident to those skilled in the art in light of the foregoing description that many further alternatives, modifications and variations are possible. Thus, the invention described herein is intended to embrace all such alternatives, modifications, applications and variations as may fall within the spirit and scope of the appended claims.

What is claimed is:

1. A rail-to-rail amplifier, comprising:
   a first input stage comprising a first input transistor and a second input transistor responsive to an input signal, and first and second input current paths;
   a second input stage comprising a third input transistor and a fourth input transistor responsive to the input signal, a third input current path coupled to the second input current path, and a fourth current path coupled to the first input current path; and
   a gain stage comprising a first node coupled to the second and third input current paths, a second node coupled to the first and fourth current paths, and a third node on which a control signal is generated;
   wherein the gain stage receives current from the first input current path combined with current from the fourth input current path and receives current from the second input current path combined with current from the third input current path when the input signal is between a first middle value and a second middle value higher than the first middle value, receives current from the first and second input current paths only when the input signal is between the second middle value and a high value, and receives current from the third and fourth input current paths only when the input signal is between a low value and the first middle value.

2. The rail-to-rail amplifier of claim 1, further comprising an output stage coupled to the gain stage, the output stage comprising a first pair of output transistors interconnected to form an output node where an output signal is generated, wherein one of the first pair of output transistors is responsive to the control signal.

3. A rail-to-rail amplifier, comprising:
a first input stage comprising a first input transistor responsive to a first input signal, a second input transistor responsive to a second input signal, and first and second input current paths;
a second input stage comprising a third input transistor responsive to the first input signal, a fourth input transistor responsive to the second input signal, a third input current path coupled to the second input current path, and a fourth current path coupled to the first input current path;
a gain stage comprising a first node coupled to the second and third input current paths, a second node coupled to the first and fourth current paths, and a third node on which a control signal is generated; and
an output stage coupled to the gain stage, the output stage comprising a first pair of output transistors interconnected to form an output node where an output signal is generated, wherein one of the first pair of output transistors is responsive to the control signal, the output stage further comprising a second pair of output transistors, one of which is responsive to the control signal.

4. The rail-to-rail amplifier of claim 3, wherein the second pair of transistors cooperate to increase the output signal range and to provide the amplifier with increased driving ability.

5. The rail-to-rail amplifier of claim 1, wherein the first input stage further comprises
a first load transistor coupled to the first input transistor,
a second load transistor coupled to the second input transistor,
a transistor coupled to the first load transistor to form a current mirror that generates current in the first current path, and
a transistor coupled to the second load transistor to form a current mirror that generates current in the second current path.

6. A rail-to-rail amplifier, comprising:
a pair of input stages, each selectively responsive to a differential input signal;
a gain stage in electrical communication with each of the input stages to amplify the differential input signal; and
an output stage comprising a first pair of field effect output transistors interconnected to form an output node where an output signal is generated, and a second pair of field effect output transistors that cooperate to increase the output signal range and to provide the amplifier with increased driving ability, wherein a gate of one of the first pair of output transistors and a gate of one of the second pair of output transistors are each responsive to a control signal that decreases when the output signal increases.

7. A rail-to-rail amplifier, comprising:
first means for receiving a differential input signal, and for selectively generating first and second input currents;
second means for receiving the differential input signal, and for selectively generating third and fourth input currents, wherein the third input current is selectively combined with the second input current and the fourth input current is selectively combined with the first input current; and
means, in electrical communication with each of the first and second receiving means, for amplifying the differential input signal and for generating a control signal, wherein the amplification means
receives the first input current combined with the fourth input current and receives the second input current combined with the third input current when the input signal is between a first middle value and a second middle value higher than the first middle value,
receives the first and second input currents only when the input signal is between the second middle value and a high value, and
receives the third and fourth input currents only when the input signal is between a low value and the first middle value.

8. The rail-to-rail amplifier of claim 7, further comprising output means comprising a first pair of output controlling means for generating an output signal, wherein one of the first pair of output controlling means is responsive to the control signal.

9. The rail-to-rail amplifier of claim 8, wherein the output means further comprises a second pair of output controlling means for increasing the output signal range and for providing the amplifier with increased driving ability, wherein one of the second pair of output controlling means is responsive to the control signal which decreases when the output signal increases.

10. The rail-to-rail amplifier of claim 7, wherein the first receiving means comprises
first current mirror means for generating the first input current, and
second current mirror means for generating the second input current.

11. A rail-to-rail amplifier, comprising:
a pair of input means, each selectively responsive to a differential input signal;
means, in electrical communication with each of the input stages, for amplifying the differential input signal and for generating a control signal; and
output means comprising a first pair of field effect output controlling means for generating an output signal, and a second pair of field effect output controlling means for increasing the output signal range and for providing the amplifier with increased driving ability, wherein a gate of one of the first pair of output controlling means and a gate of one of the second pair of output controlling means are each responsive to the control signal that decreases when the output signal increases.

* * * * *